(12) United States Patent
Li et al.

(10) Patent No.: US 12,513,831 B2
(45) Date of Patent: Dec. 30, 2025

(54) FLEXIBLE PRINTED CIRCUIT BOARD AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xin Li, Beijing (CN); Wen Liu, Beijing (CN); Qing Gong, Beijing (CN); An Fu, Beijing (CN); Tieyi Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 375 days.

(21) Appl. No.: 18/024,017

(22) PCT Filed: Mar. 31, 2022

(86) PCT No.: PCT/CN2022/084285
§ 371 (c)(1),
(2) Date: Feb. 28, 2023

(87) PCT Pub. No.: WO2023/184300
PCT Pub. Date: Oct. 5, 2023

(65) Prior Publication Data
US 2024/0284607 A1    Aug. 22, 2024

(51) Int. Cl.
*H05K 5/00* (2025.01)
*H05K 1/03* (2006.01)
*H05K 7/20* (2006.01)

(52) U.S. Cl.
CPC ......... *H05K 5/0069* (2013.01); *H05K 1/0393* (2013.01); *H05K 7/20963* (2013.01);
(Continued)

(58) Field of Classification Search
None
See application file for complete search history.

(56) References Cited

U.S. PATENT DOCUMENTS 12,156,716 B1 *    12/2024    Napoles .................. A61B 5/681
2012/0268153 A1 *  10/2012    Nickel ................ G01R 31/3025
                                                      324/754.31
(Continued)

FOREIGN PATENT DOCUMENTS

CN    203134973 U    8/2013
CN    103904412 A    7/2014
(Continued)

*Primary Examiner* — Wilson Lee
(74) *Attorney, Agent, or Firm* — IPro, PLLC

(57) ABSTRACT

The present disclosure provides a flexible printed circuit board and a display apparatus. The flexible printed circuit board includes a plurality of bonding pins, where the plurality of bonding pins are configured to be bonded with a display panel, and the plurality of bonding pins include impedance test pins; and an antenna coil, including two metal connecting wires and the two impedance test pins, where the metal connecting wires are electrically connected between the impedance test pins and a near field communication module; and when the plurality of bonding pins are bonded with the display panel, the two impedance test pins are electrically connected through a conducting wire in the display panel.

15 Claims, 13 Drawing Sheets

(52) U.S. Cl.
CPC .............. *H05K 2201/10098* (2013.01); *H05K 2201/10287* (2013.01)

(56) References Cited

U.S. PATENT DOCUMENTS

| | | | |
|---|---|---|---|
| 2012/0306521 A1* | 12/2012 | Nickel | H01L 21/00 |
| | | | 324/754.03 |
| 2015/0340754 A1 | 11/2015 | Asou et al. | |
| 2016/0064814 A1* | 3/2016 | Jang | H05K 9/0075 |
| | | | 174/377 |
| 2016/0294058 A1* | 10/2016 | Tunnell | H04W 4/80 |
| 2020/0209171 A1* | 7/2020 | Abou-Khousa | G01R 33/34 |
| 2020/0321690 A1* | 10/2020 | Paulotto | H01Q 1/22 |
| 2023/0088027 A1* | 3/2023 | Wang | G06F 3/0412 |

FOREIGN PATENT DOCUMENTS

| | | |
|---|---|---|
| CN | 105098363 A | 11/2015 |
| CN | 206401524 U | 8/2017 |
| CN | 213241783 U | 5/2021 |
| CN | 113067141 A | 7/2021 |

\* cited by examiner

FLEXIBLE PRINTED CIRCUIT BOARD AND DISPLAY APPARATUS

FIELD

The present disclosure relates to the field of near field communication, in particular to a flexible printed circuit board and a display apparatus.

BACKGROUND

At present, mobile phones and other terminal products are becoming increasingly light and thin. In this case, the performance and selection of antennas become gradually restricted, and a near field communication (NFC) function is abandoned in many terminal products due to insufficient internal space.

However, the NFC function has been widely applied to terminal products in scenes including near field payment, face-to-face adding friends, etc., and abandoning the NFC function would lower user experience.

Therefore, how to reduce the space occupied by an NFC antenna has become an urgent technical problem to be solved.

SUMMARY

Embodiments of the present disclosure provide a flexible printed circuit board and a display apparatus to solve the above technical problem.

In a first aspect, in order to solve the above technical problem, an embodiment of the present disclosure provides a flexible printed circuit board, including:

a plurality of bonding pins, where the plurality of bonding pins are configured to be bonded with a display panel, and the plurality of bonding pins include impedance test pins; and an antenna coil, including two metal connecting wires and the two impedance test pins, where the metal connecting wires are electrically connected between the impedance test pins and a near field communication module, and when the plurality of bonding pins are bonded with the display panel, the two impedance test pins are electrically connected through a conducting wire in the display panel.

In one possible implementation, in the two metal connecting wires, one metal connecting wire is arranged as a helical wire, and the other metal connecting wire is located on an outer side of the helical wire and partially surrounds the helical wire.

In one possible implementation, the helical wire is a quadrate helical wire, and the other metal connecting wire is a broken wire surrounding the quadrate helical wire by half; or the helical wire is a circular helical wire, and the other metal connecting wire is an arc surrounding the circular helical wire by half.

In one possible implementation, the metal connecting wires include:

a plurality of sub-metal wires; and a metal jumper wire, where the metal jumper wire is electrically connected to two adjacent sub-metal wires of the plurality of sub-metal wires.

In one possible implementation, the flexible printed circuit board further includes:

a first base material layer arranged close to the display panel, where the metal connecting wires are arranged on any surface of the first base material layer; and no entire metal layer is arranged on a surface of a side, facing away from the display panel, of the first base material layer; and at least one second base material layer, laminated on a side, away from the display panel, of the first base material layer: where the plurality of bonding pins are arranged on a surface of a side of one of the at least one second base material layer; and an orthographic projection of a region, corresponding to the bonding pins, of the one second base material layer provided with the plurality of bonding pins does not overlap with an orthographic projection of at least one second base material layer close to the plurality of bonding pins.

In one possible implementation, the flexible printed circuit board further includes:

a connecting end, arranged on a surface of a side, away from the first base material layer, of the second base material layer farthest from the first base material layer in the at least one second base material layer: where the connecting end is configured to be electrically connected with the near field communication module;

where when the metal connecting wires are arranged on a surface of a side, away from the second base material layer, of the first base material layer, the connecting end is electrically connected to the antenna coil through a connecting hole that penetrates through the at least one second base material layer and the first base material layer; and when the metal connecting wires are arranged on a surface of a side, close to the second base material layer, of the first base material layer, the connecting end is electrically connected to the antenna coil through a connecting hole that penetrates through the at least one second base material layer.

In one possible implementation, the flexible printed circuit board further includes:

a device and a routing wire connecting the device and the bonding pins;

where the device is arranged at the same layer as the connecting end, and the routing wire is arranged on a surface of any second base material layer.

In one possible implementation, the flexible printed circuit board further includes:

an anti-electromagnetic interference layer, arranged on a surface of a side, close to the display panel, of the first base material layer: where an orthographic projection of the anti-electromagnetic interference layer on the first base material layer does not overlap with an orthographic projection of the metal connecting wires on the first base material layer.

In one possible implementation, when the metal connecting wires are arranged on the surface of the side, close to the display panel, of the first base material layer, the anti-electromagnetic interference layer covers the metal connecting wires.

In one possible implementation, in the at least one second base material layer closest to the first base material layer, an orthographic projection of the metal connecting wires on the corresponding second base material layer does not overlap with the routing wire and device on the surface of the corresponding second base material layer.

In one possible implementation, the flexible printed circuit board further includes:

a test end, arranged on the surface of the side, away from the second base material layer, of the first base material layer: where the test end is electrically connected to one end, close to the near field communication module, of the metal connecting wires; and the test end is configured to connect an impedance test tool.

In a second aspect, an embodiment of the present disclosure provides a display apparatus, including:
- a display panel, the flexible printed circuit board according to the first aspect, and a near field communication module;
- where the flexible printed circuit board is located on a back side of a display surface of the display panel, and a plurality of bonding pins in the flexible printed circuit board are bonded with the display surface of the display panel; and
- the near field communication module is electrically connected to the antenna coil in the flexible printed circuit board.

In one possible implementation, the display apparatus further includes:
- a super clean foam (SCF) composite film, located between a back side of the display panel and the flexible printed circuit board, where the SCF composite film includes a heat dissipation layer, a buffer layer and an adhesive layer which are arranged in a laminated manner, the adhesive layer is fixed to the back side of the display panel, the heat dissipation layer has a digging hole region, and an orthographic projection of the digging hole region on the flexible printed circuit board covers metal connecting wires of the antenna coil.

In one possible implementation, the display apparatus further includes: insulation paste filling the digging hole region of the heat dissipation layer.

In one possible implementation, the antenna coil is connected to the near field communication module through a clip.

Figure 1:
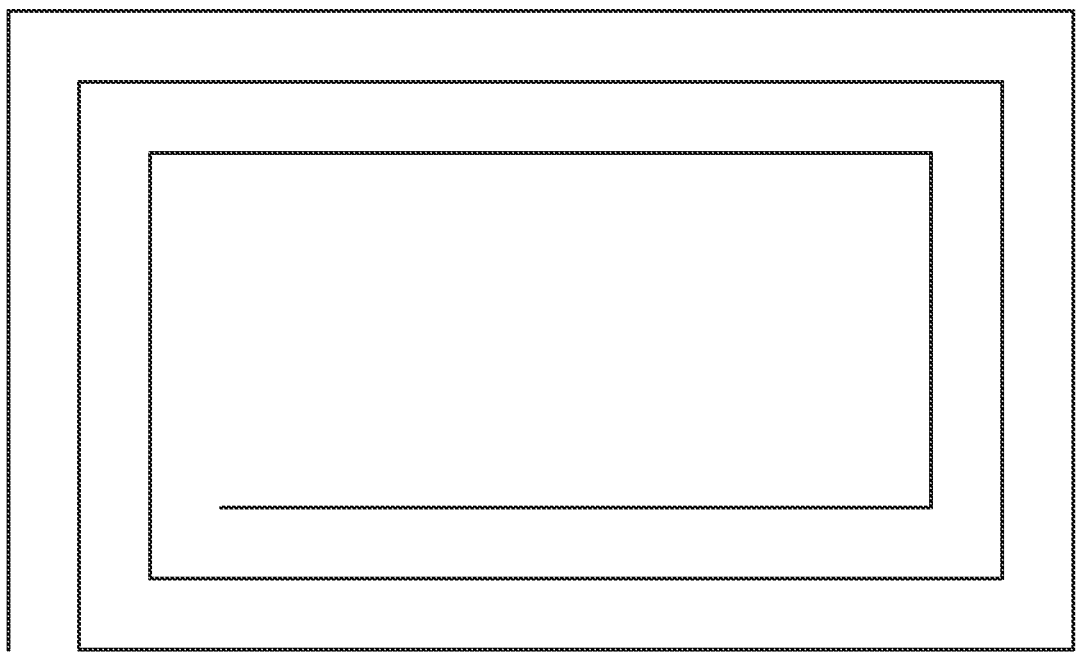
FIG. 1 is a schematic diagram of a form of an antenna in the related art.

Reference numerals: bonding pin 1, impedance test pin 12, antenna coil 2, metal connecting wire 21, first end 21a of metal connecting wire 21, second end 21b of metal connecting wire 21, first base material layer 3, second base material layer 4, connecting end 5, connecting hole 6, device 7, routing wire 8, anti-electromagnetic interference layer 9; and display panel 100, flexible printed circuit board 200, near field communication module 300, digging hole region B.

DETAILED DESCRIPTION OF THE EMBODIMENTS

Embodiments of the present disclosure provide a flexible printed circuit board and a display apparatus to solve the technical problem that an NFC antenna occupies a large space.

In order to make above objectives, characteristics and advantages of the present disclosure clearer and more understandable, the present disclosure will be further described below in combination with the accompanying drawings and embodiments. However, an exemplary implementation can be realized in a plurality of forms and should not be understood to be limited to the implementations described here. On the contrary, these implementations are provided to make the present disclosure more comprehensive and complete, and to comprehensively convey the concepts of the exemplary implementations to those of skill in the art. The same labels in the drawings represent the same or similar structures, so repetitive description thereof is omitted. All words indicating locations and directions described in the present disclosure are described by taking the accompanying drawings as examples, but changes may also be made as needed, and such changes shall all be included in the scope of protection of the present disclosure. The accompanying drawings of the present disclosure are merely used for illustrating relative locational relations and do not represent the true scale.

It should be noted that, specific details are described herein for the purpose of thorough understanding of the present disclosure, but the present disclosure can be implemented in many methods other than those described here, and those of skill in the art can make similar promotion under the condition of not violating the content of the present disclosure. Therefore, the present disclosure is not limited by specific implementations disclosed below. The subsequent description is preferred implementations for implementing the present disclosure, but such description is for the purpose of describing general principles of the present disclosure, rather than for limiting the scope of the present disclosure. The scope of protection of the present disclosure shall be subject to the claims.

In the related art, antennas in a terminal product are usually designed in a laser-direct-structuring (LDS) manner. A communication distance of NFC is usually 10 cm or so, a working frequency is 13.5 MHZ, a maximum transmittance speed is 424 Kbit, an antenna form of NFC is usually designed to be a closed-type coil form, and an inductive is formed through changes of current in the closed coil to radiate signals outward. FIG. 1 is a schematic diagram of a form of an antenna in the related art, one of two ends of the antenna in FIG. 1 is led out to be a feed signal, and the other end serves as a ground point to be electrically connected with a communication module.

A flexible printed circuit board and a display apparatus provided by embodiments of the present disclosure are described in detail below in combination with the accompanying drawings.

Figure 2:
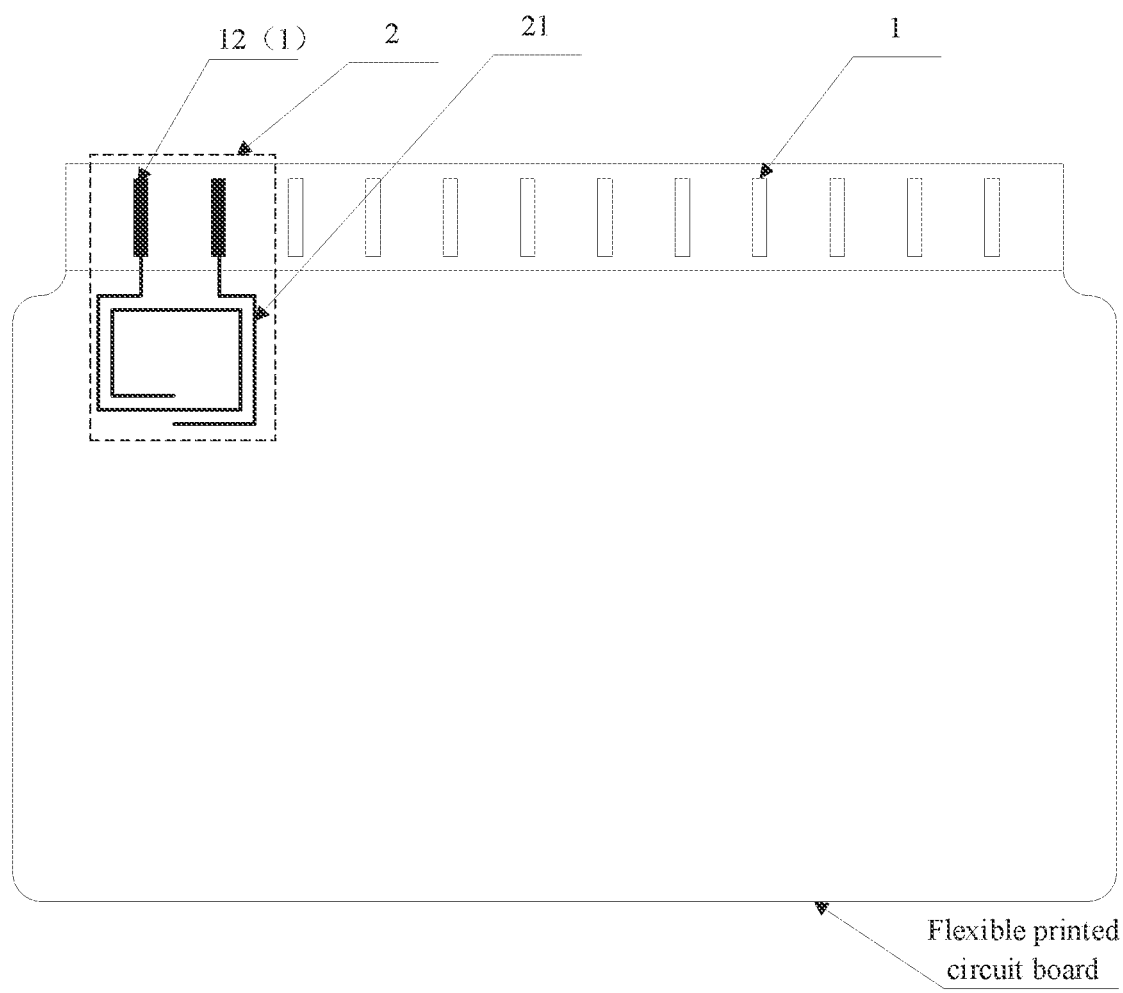
FIG. 2 is a schematic structural diagram of a flexible printed circuit board provided by an embodiment of the present disclosure.

FIG. 2 is a schematic structural diagram of the flexible printed circuit board provided by embodiments of the present disclosure. The flexible printed circuit board includes: a plurality of bonding pins 1, where the plurality of bonding pins 1 are configured to be bonded with a display panel (not shown in FIG. 2), and the plurality of bonding pins 1 include impedance test pins 12; and normally the impedance test pins 12 are located at an edge of the plurality of bonding pins 1.

In the related art, after the plurality of bonding pins 1 are bonded with the display panel, the two impedance test pins 12 may be in a conducting status. In this way, in a production process, the impedance test pins 12 may be electrically connected to an impedance test tool through connecting wires led out from the two impedance test pins 12, and therefore, impedance of the bonding pins 1 after bonding with the display panel is measured.

It should be understood that although the label number of the two impedance test pins 12 in FIG. 2 are different from that of the bonding pins 1, which is for the purpose of better description, the impedance test pins 12 in fact belong to the plurality of bonding pins 1.

The flexible printed circuit board further includes an antenna coil 2 which includes two metal connecting wires 21 and the two impedance test pins 12. The metal connecting wires 21 are electrically connected between the impedance test pins 12 and a near field communication module (not shown in FIG. 2), and when the plurality of bonding pins 1 are bonded with the display panel, the two impedance test pins 12 are electrically connected through a conducting wire in the display panel. After the plurality of bonding pins 1 are bonded with the display panel, the conducting wire in the display panel is connected between the two impedance test pins 12, so that the two impedance test pins 12 are electrically connected through the conducting wire in the display panel.

In the embodiments provided by the present disclosure, the antenna coil 2 is constructed through the two impedance test pins 12 used for measuring impedance of the bonding pins 1 in the related art and connecting wires thereof (i.e. the metal connecting wires 21) as well as a loop formed after the bonding pins 1 are bonded with the display panel, and the loop measuring the impedance of the bonding pins 1 is reused as the antenna coil 2 of the near field communication module at the same time, so that no new space is occupied for arranging the antenna coil 2 and a technical effect of saving the space of the flexible printed circuit board on the premise of maintaining a near field communication function is realized. In addition, because the impedance test loop of the bonding pins 1 is reused as the antenna coil 2, no extra material or space is needed for arranging the antenna coil 2 separately, and therefore cost can be effectively saved.

Figure 3:
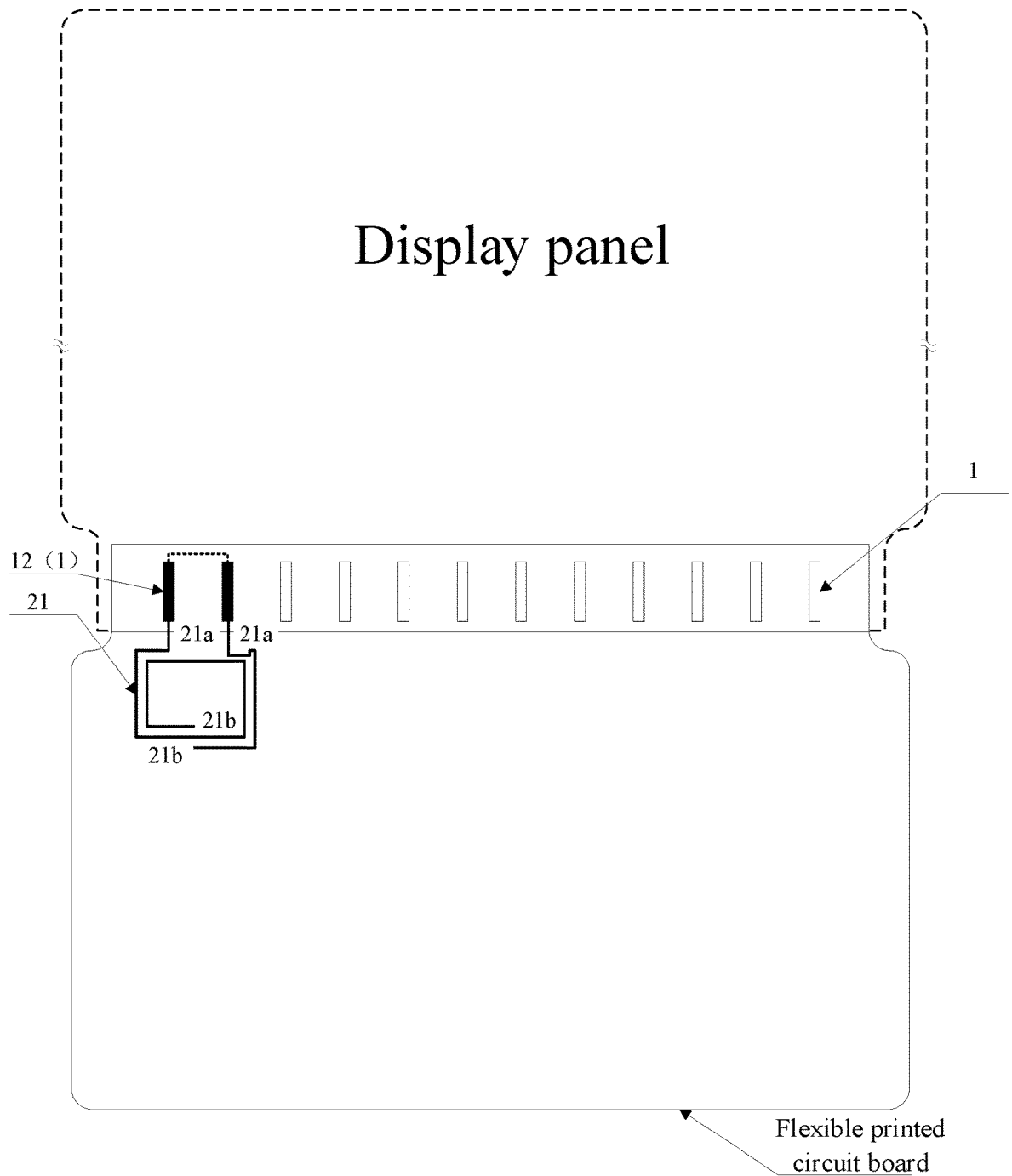
FIG. 3 is a schematic diagram of connection of an antenna coil provided by an embodiment of the present disclosure.

FIG. 3 is a schematic diagram of connection of an antenna coil provided by an embodiment of the present disclosure. First ends 21a of the metal connecting wires 21 are electrically connected to the impedance test pins 12, and second ends 21b of the metal connecting wires 21 are electrically connected to the near field communication module (not shown in FIG. 3).

It should be understood that two connecting ends of the near field communication module are respectively electrically connected to the second ends of the two metal connecting wires, and it should not be understood as that the near field communication module has only one connecting end.

Figure 4:
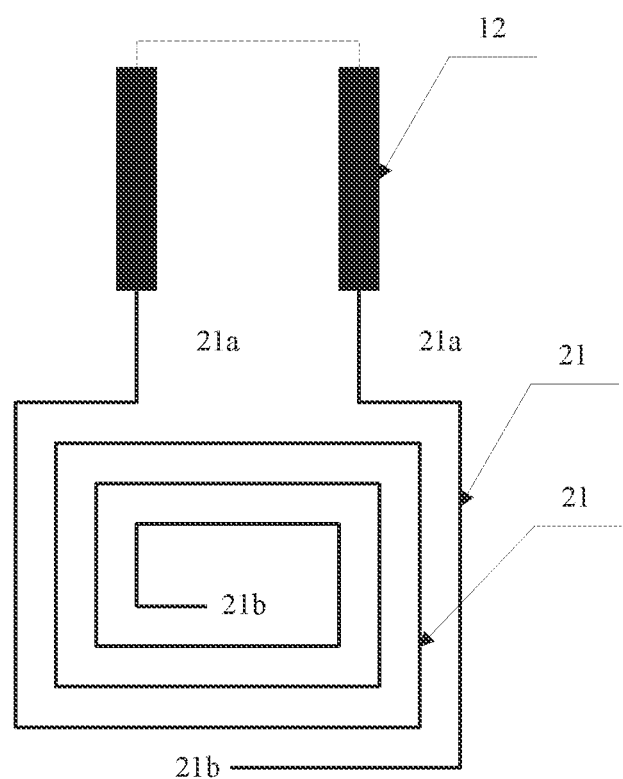
FIGS. 4-6 are schematic structural diagrams of an antenna coil provided by embodiments of the present disclosure.
Figure 5:
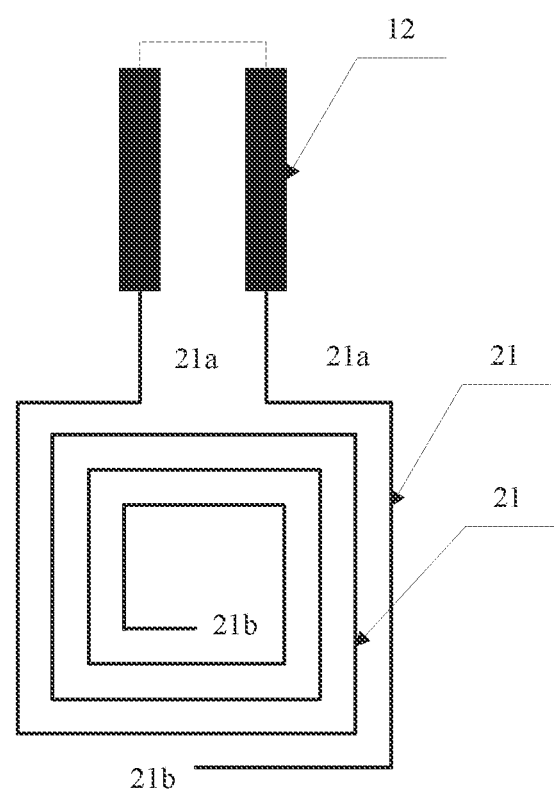
Figure 6:
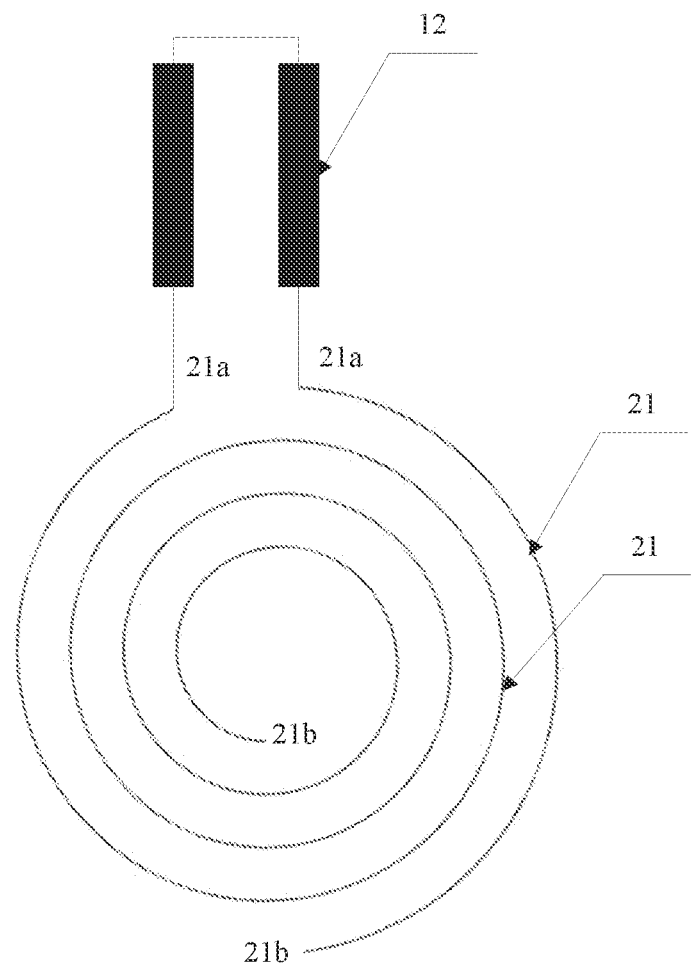

FIGS. 4-6 are schematic structural diagrams of an antenna coil provided by embodiments of the present disclosure. In the two metal connecting wires 21 in the antenna coil 2, one metal connecting wire 21 is arranged as a helical wire, and the other metal connecting wire 21 is located on an outer side of the helical wire and partially surrounds the helical wire.

As shown in FIG. 4 and FIG. 5, the metal connecting wire 21 arranged as the helical wire is a quadrate helical wire, and the other metal connecting wire 21 is a broken wire surrounding the quadrate helical wire by half. The quadrate helical wire may be a rectangular helical wire as shown in FIG. 4, or a square helical wire as shown in FIG. 5.

As shown in FIG. 6, the metal connecting wire 21 arranged as the helical wire is a circular helical wire, and the other metal connecting wire 21 is an arc surrounding the circular helical wire by half.

In the embodiments provided by the present disclosure, one metal connecting wire is arranged to be the quadrate helical wire or the circular helical wire, and the other metal connecting wire is arranged to be the broken wire surrounding the quadrate helical wire by half or the arc surrounding the circular helical wire by half. In this way, the metal connecting wires 21 of the antenna coil 2 may adapt to a shape of a remaining space in the flexible printed circuit board, and a success rate of arranging the antenna coil 2 is improved.

Figure 7:
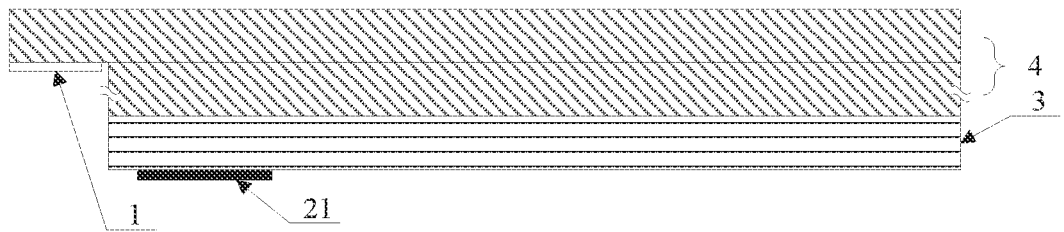
FIGS. 7-9 are sectional diagrams of a flexible printed circuit board in a thickness direction provided by embodiments of the present disclosure.
Figure 8:
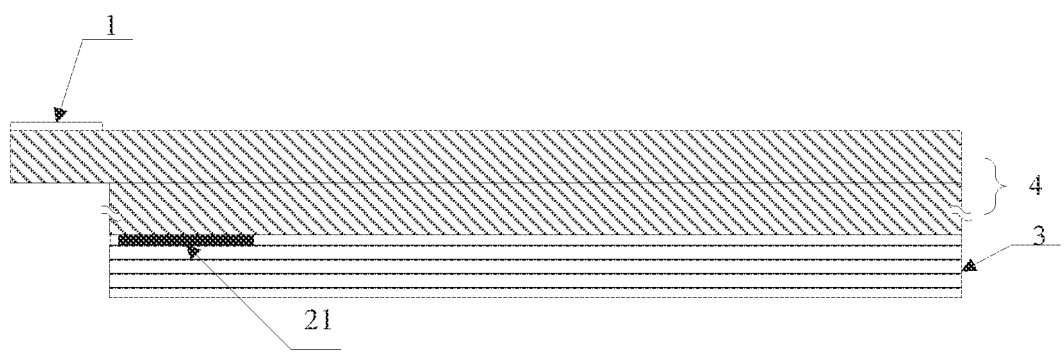
Figure 9:
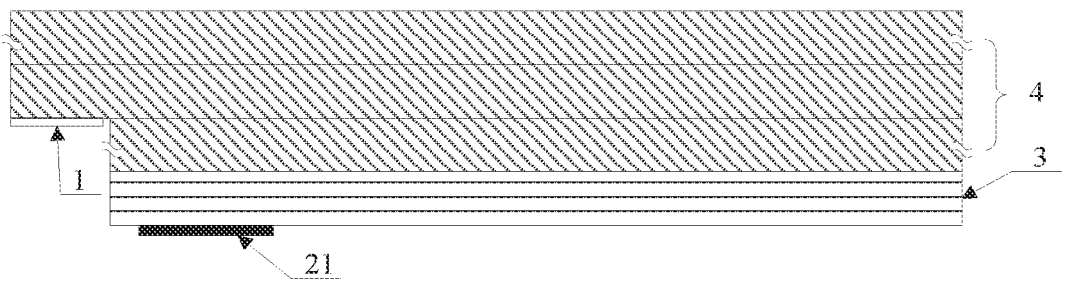

FIGS. 7-9 are sectional diagrams of a flexible printed circuit board in a thickness direction provided by embodiments of the present disclosure. The flexible printed circuit board further includes:

a first base material layer 3 arranged close to the display panel; where the metal connecting wires 21 are arranged on any surface of the first base material layer 3; and no entire metal layer is arranged on a surface of a side, facing away from the display panel, of the first base material layer 3. As shown in FIG. 7 and FIG. 9, the metal connecting wires 21 may be arranged on a surface of a side, away from a second base material layer 4, of the first base material layer 3, and at the same time, no entire metal layer is arranged on the surface of the side, facing away from the display panel, of the first base material layer 3; or the metal connecting wires may be arranged on a surface of a side, close to the second base material layer 4, of the first base material layer 3. Normally in the field of circuit board manufacturing, a protective layer is further arranged on the side, facing away from the first base material layer 3, of the first metal connecting wires 21 to protect the metal connecting wires 21 and other wires on the same layer as the metal connecting wires 21 from physical breakage and protect a shape of wiring; and the protective layer may, for example, be acrylic oligomer (commonly known as green oil); and at least one second base material layer 4; where the at least one second base material layer 4 is laminated on a side, away from the display panel, of the first base material layer 3; the plurality of bonding pins 1 are arranged on a surface of a side of one of at least one second base material layer 4; and an orthographic projection of a region, corresponding to the plurality of bonding pins 1, of the one second base material layer 4 provided with the plurality of bonding pins 1 does not overlap with an orthographic projection of at least one second base material layer 4 close to the plurality of bonding pins.

As shown in FIG. 7 and FIG. 8, the plurality of bonding pins 1 may be arranged on any surface of the second base material layer 4 (normally known as a top base material layer) farthest from the first base material layer 3, or as shown in FIG. 9, the plurality of bonding pins 1 may be arranged on any surface of one second base material layer 4 between the second base material layer 4 farthest from the first base material layer 3 and the first base material layer 3. Specifically, the plurality of bonding pins 1 may be freely arranged on a surface of a second base material layer 4 according to a bonding region of the display panel.

An orthographic projection of the region of the plurality of bonding pins 1 corresponding to the top base material layer, as shown in FIG. 8, may not overlap with the orthographic projection of the remaining second base material layer 4 and the first base material layer 3: or as shown in FIG. 9, may not overlap with the base material layer close to the plurality of bonding pins 1 (i.e. the second base material layer 4 close to a surface where the plurality of pins are located and the first base material layer 3 in FIG. 9), so that the second base material layer 4 where the plurality of bonding pins 1 are located may be supported by the second base material layer 4 facing away from the plurality of pins, the tenacity of the region where the plurality of bonding pins 1 are located is improved, and therefore a service life thereof is prolonged.

In the embodiments provided by the present disclosure, by arranging the metal connecting wires 21 of the antenna coil 2 on the surface, close to the display panel, of the first base material layer 3, a signal radiation direction of the antenna coil 2 may be mainly towards the side of the display panel, so that interference of the antenna coil 2 on a circuit on a side facing away from the display panel may be reduced. The plurality of bonding pins 1 are arranged on the surface of the side of one second base material layer 4; and the orthographic projection of the region, corresponding to the plurality of bonding pins 1, of the second base material layer 4 provided with the plurality of bonding pins 1 does not overlap with the orthographic projection of the remaining second base material layers 4 and the first base material layer 3, so that the plurality of pins may be arranged freely based on a location of the bonding region of the display panel.

Figure 10:
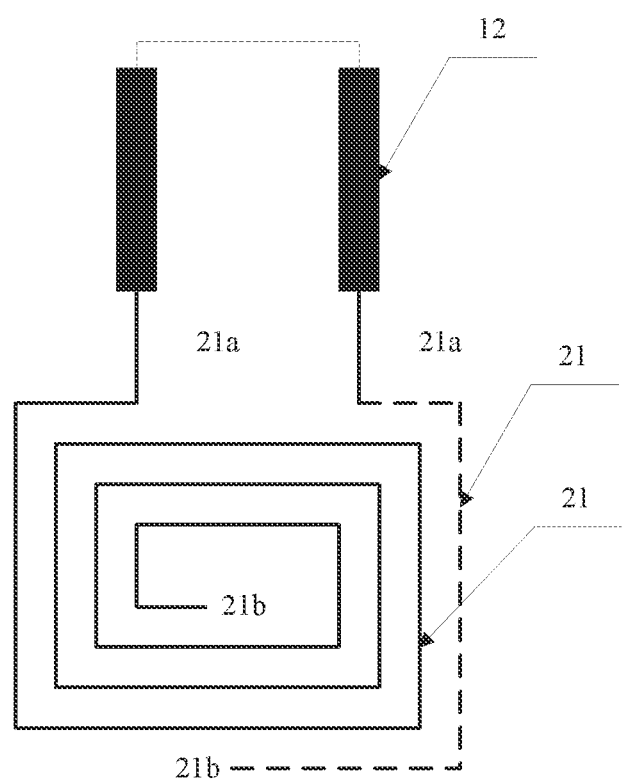
FIG. 10 is a schematic structural diagram of two metal connecting wires in an antenna coil provided by an embodiment of the present disclosure.

FIG. 10 is a schematic structural diagram of two metal connecting wires in an antenna coil provided by an embodiment of the present disclosure. The two metal connecting wires 21 in the antenna coil 2 may be arranged on the same layer (as shown in FIG. 2-FIG. 6), or may be arranged on different layers as shown in FIG. 10. In FIG. 10, the two metal connecting wires 21 are arranged as different wire types of to indicate that they are located on different layers. That is, one metal connecting wire 21 is arranged on the surface of the side, close to the display panel, of the first base material layer 3; and the other metal connecting wire 21 is arranged on the surface of the side, facing away from the display panel, of the first base material layer 3.

Figure 11:
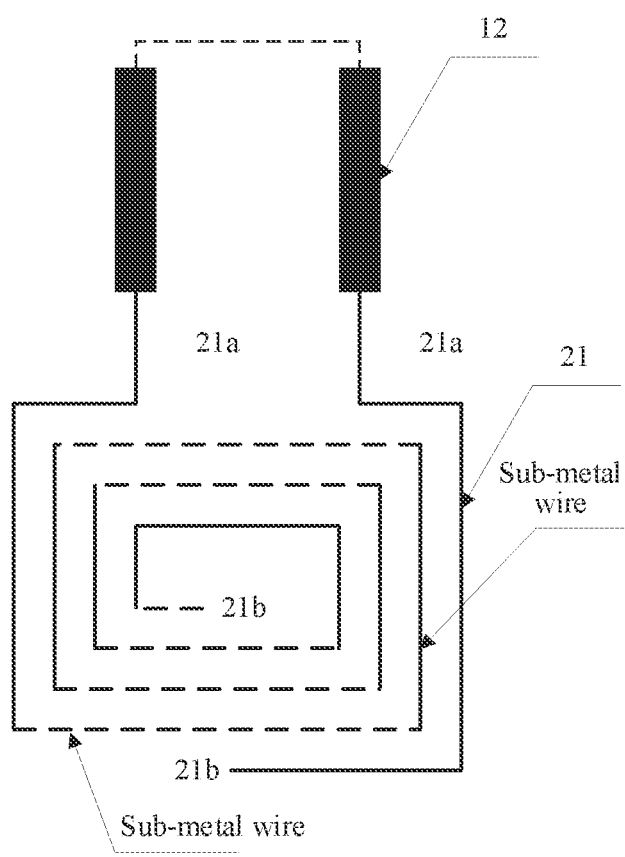
FIG. 11 is a schematic structural diagram of another antenna coil provided by an embodiment of the present disclosure.

FIG. 11 is a schematic structural diagram of another antenna coil provided by an embodiment of the present disclosure. The metal connecting wire 21 of the antennal coil 2 includes at least one sub-metal wire. When the metal connecting wire 21 includes only one sub-metal wire, the sub-metal wire is the corresponding metal connecting wire 21; and when the metal connecting wire 21 includes a plurality of sub-metal wires, a part of sub-metal wires 21 may be arranged on different layers. Namely, as shown in FIG. 11, the sub-metal wire shown in a full line and the sub-metal wire shown in a dotted line in the metal connecting wire 21 arranged to be a quadrate helical wire are located on different sides of the first base material layer 3, and two adjacent sub-metal wires may be electrically connected through a connecting hole that penetrates through the first base material layer 3. If the sub-metal wires in the metal connecting wire 21 are arranged on the same layer, two corresponding sub-metal wires may be electrically connected through a jumper wire arranged in another base material layer, such as a second base material layer 4 adjacent to the first base material layer 3.

Figure 12:
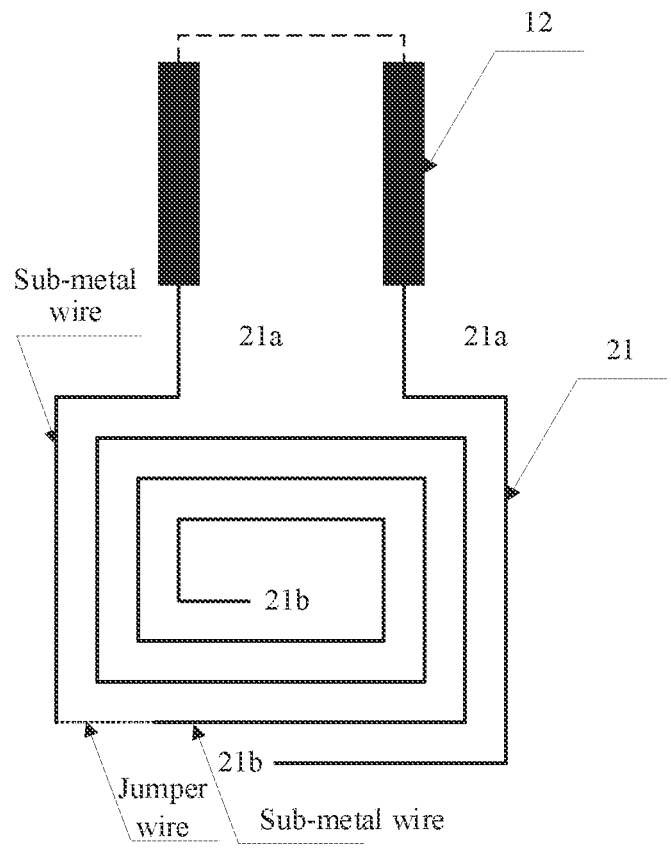
FIG. 12 is a schematic structural diagram of another antenna coil provided by an embodiment of the present disclosure.

FIG. 12 is a schematic structural diagram of another antenna coil provided by an embodiment of the present disclosure. When the metal connecting wires 21 include a plurality of sub-metal wires, the metal connecting wires 21 further include: a metal jumper wire, where the metal jumper wire is electrically connected to two adjacent sub-metal wires.

As shown in FIG. 12, the two sub-metal wires in the metal connecting wire 21 arranged to be the quadrate helical wire are arranged on the same layer, the metal jumper wire and the two sub-metal wires are arranged on different layers, and the metal jumper wire is electrically connected to the two sub-metal wires through a connecting hole that penetrates through the first base material layer 3.

Figure 13:
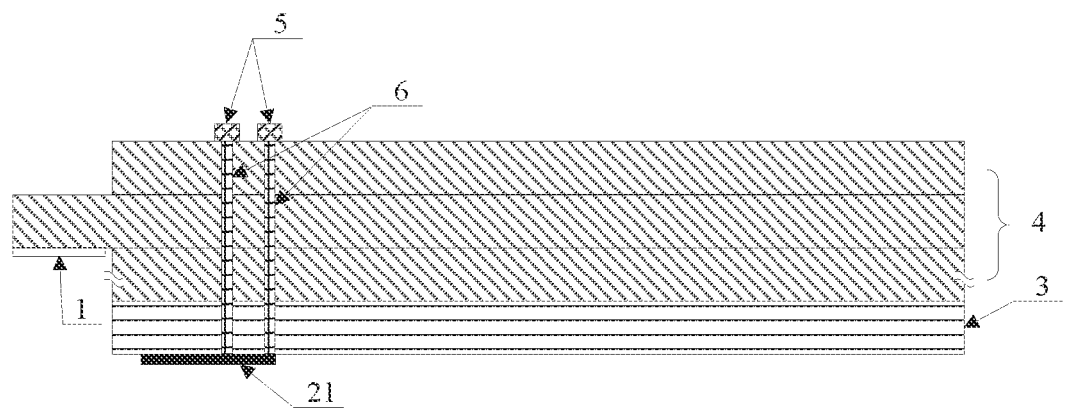
FIG. 13 and FIG. 14 are sectional diagrams of another flexible printed circuit board in a thickness direction provided by embodiments of the present disclosure.
Figure 14:
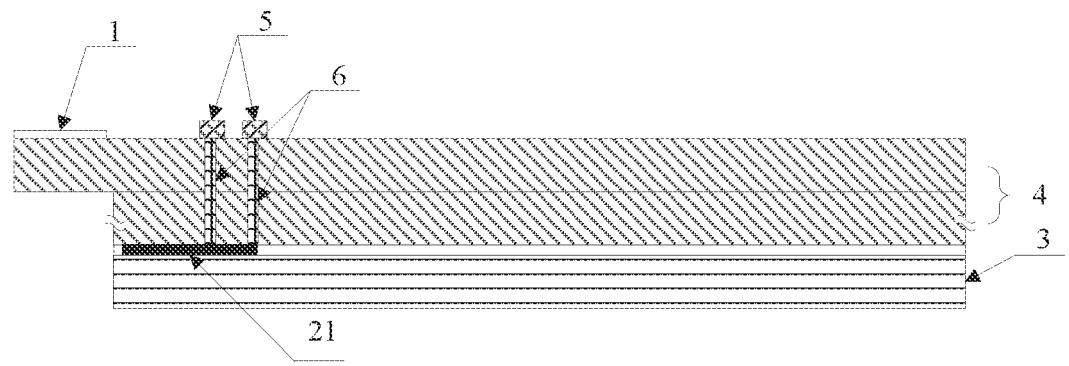

FIG. 13 and FIG. 14 are sectional diagrams of another flexible printed circuit board in a thickness direction provided by embodiments of the present disclosure. The flexible printed circuit board further includes: a connecting end 5 arranged on a surface of a side, away from the first base material layer 3, of the second base material layer 4 farthest from the first base material layer 3 in the at least one second base material layer 4; where the connecting end 5 is configured to be electrically connected with the near field communication module. Because the antennal coil 2 has two ends, there are two connecting ends 5 correspondingly, and the two connecting ends 5 are respectively electrically connected to the ends (i.e. the second ends 21b of the metal connecting wires 21), away from the bonding pins 1, of the two metal connecting wires 21 of the antenna coil 2. Before the above connecting ends 5 are connected with the near field communication module, the connecting ends 5 may also be reused as test ends of the impedance test tool to be connected with the impedance test tool, so as to perform impedance test of the bonding pins 1.

When the metal connecting wires 21 are arranged on a surface of a side, away from the second base material layer 4, of the first base material layer 3, the connecting ends 5 are electrically connected to the antenna coil 2 through connecting boles 6 that penetrate through all second base material layers 4 and the first base material layer 3.

When the metal connecting wires 21 are arranged on a surface of a side, close to the second base material layer 4, of the first base material layer 3, the connecting ends 5 are electrically connected to the antenna coil 2 through connecting holes 6 that penetrate through all second base material layers 4. The connecting ends 5 are electrically connected to the second ends 21b of the corresponding metal connecting wires 21 through the above connecting holes 6.

It should be understood that, in the sectional diagrams of FIG. 13 and FIG. 14, because the two metal connecting wires 21 overlap with each other in the sectional diagrams, it seems from FIG. 13 and FIG. 14 that the two connecting holes 6 are connected to one metal connecting wire 21, but in fact the two connecting holes 6 are connected to different metal connecting wires 21.

In the embodiments provided by the present disclosure, the connecting ends 5 are arranged on the surface, facing away from the first base material layer 3, of the second base material layer 4 farthest from the first base material layer 3, so that the connecting ends 5 may be conveniently connected to the near field communication module outside the flexible printed circuit board. The second ends 21b of the metal connecting wires 21 are connected with the connecting ends 5 through the connecting holes 6, and the metal connecting wires 21 of the antenna coil 2 may be arranged on the first base material layer 3 different from the second base material layer 4 where the connecting ends 5 are located, so the metal connecting wires 21 may be conveniently arranged.

Figure 15:
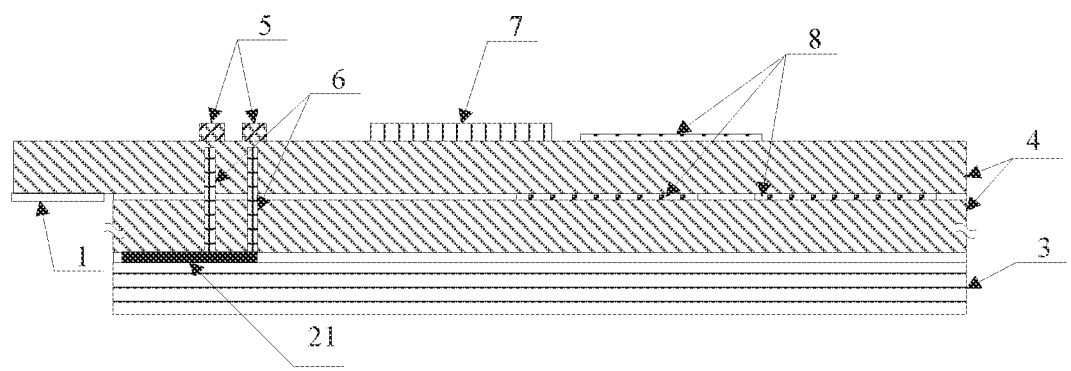
FIG. 15 is a sectional diagram of another flexible printed circuit board provided by an embodiment of the present disclosure.

FIG. 15 is a sectional diagram of another flexible printed circuit board provided by an embodiment of the present disclosure. The flexible printed circuit board further includes: a device 7 and a routing wire 8 connecting the device 7 and the bonding pins 1. The device 7 is arranged at the same layer as the connecting ends 5, and the routing wire 8 is arranged on a surface of any second base material layer 4.

If the device 7 is arranged on the same layer as the bonding pins 1, the routing wire 8 connecting the device 7 and the bonding pins 1 may be arranged on the same layer as the device 7 and the bonding pins 1; and if the device 7 is arranged on a different layer from the bonding pins 1, the routing wire 8 connecting the device 7 and the bonding pins 1 may be arranged on the same layer as the device 7 or the bonding pins 1, and the routing wire 8 may be connected to the corresponding device 7 or bonding pins 1 through the corresponding connecting hole. Of course, a part of the routing wire 8 may be arranged on the same layer as the device 7, and the other part of the routing wire 8 may be arranged on the same layer as the bonding pins 1; or the routing wire 8 is arranged on another surface of the second base material layer 4 between the surface where the bonding pins 1 are located and the surface where the device 7 is located, which is not specifically limited here. In this way, a degree of freedom of arrangement of the routing wire 8 may be improved, and wiring may be flexibly arranged based on actual needs.

FIG. 15 does not illustrate a connection relation among the routing wire 8, the device 7 and bonding pins 1, but merely illustrates locations of the device 7 and a bonding wire.

In the embodiments provided by the present disclosure, by arranging the device 7 on the same layer as the connecting ends 5, i.e. arranging the device 7 on the surface, away from the first base material layer 3, of the second base material layer 4 farthest from the first base material layer 3, the device 7 and the routing wire 8 may be conveniently arranged; and by arranging the routing wire 8 connecting the device 7 and the bonding pins 1 on any second base material layer 4, the routing wire 8 connecting the device 7 and the bonding pins 1 may be flexibly arranged based on actual needs.

Figure 16:
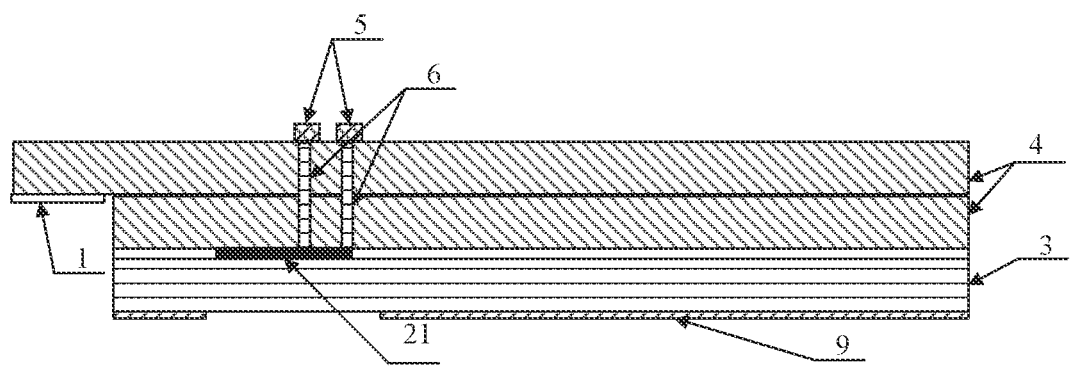
FIG. 16 and FIG. 17 are schematic structural diagrams of another flexible printed circuit board provided by embodiments of the present disclosure.
Figure 17:
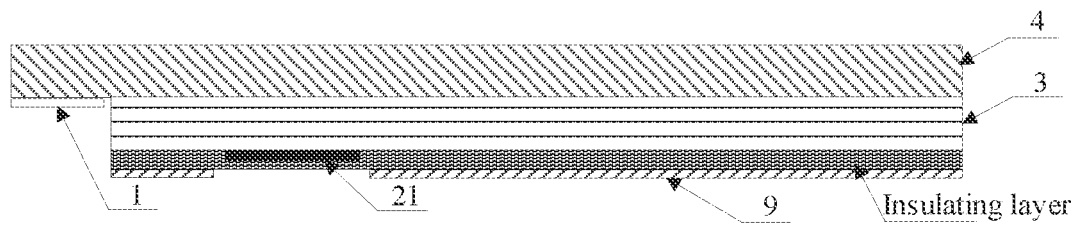

FIG. 16 and FIG. 17 are schematic structural diagrams of another flexible printed circuit board provided by embodiments of the present disclosure. The flexible printed circuit board further includes: an anti-electromagnetic interference layer 9, arranged on a surface of a side, close to the display panel, of the first base material layer 3; where an orthographic projection of the anti-electromagnetic interference layer 9 on the first base material layer 3 does not overlap with an orthographic projection of the metal connecting wires 21 on the first base material layer 3. The anti-electromagnetic interference layer 9 is a metal layer, for example, a copper layer.

As shown in FIG. 16, when the metal connecting wires 21 are arranged on the surface of the side, facing away from the display panel, of the first base material layer 3, the anti-electromagnetic interference layer 9 may be directly arranged on the surface of the side, close to the display panel, of the first base material layer 3.

As shown in FIG. 17, when the metal connecting wires 21 are arranged on the surface of the side, close to the display panel, of the first base material layer 3, the anti-electromagnetic interference layer 9 covers the metal connecting wires 21. If the two metal connecting wires 21 of the antenna coil 2 are arranged on two surfaces of the first base material layer 3 respectively, the anti-electromagnetic interference layer 9 covers the metal connecting wire 21 arranged on the side, close to the display panel, of the first base material layer 3.

It needs to be understood that, when the anti-electromagnetic interference layer 9 is arranged on the same side surface of the first base material layer 3 as the metal connecting wires 21, an insulating layer is further arranged between the anti-electromagnetic interference layer 9 and the metal connecting wires 21. Similarly, when two adjacent surfaces of the first base material layer 3 and the adjacent second base material layer 4, if conducting components are arranged on both the two surfaces, such as metal wires, metal layers, etc., an insulating layer is definitely arranged between the two surfaces.

In the embodiments provided by the present disclosure, by arranging the metal connecting wires 21 on the surface of the side, close to the display panel, of the first base material layer 3, or by arranging the metal connecting wires 21 on the surface of the side, close to the display panel, of the first base material layer 3, the anti-electromagnetic interference layer 9 covers the corresponding metal connecting wires 21, and an orthographic projection of the anti-electromagnetic interference layer 9 on the first base material layer does not overlap with an orthographic projection of the metal connecting wires on the first base material layer, so that interference among signals of the antennal coil 2 and of the device 7 and wires in the second base material layer 4 may be prevented, and reliability of the flexible printed circuit board may be improved.

Figure 18:
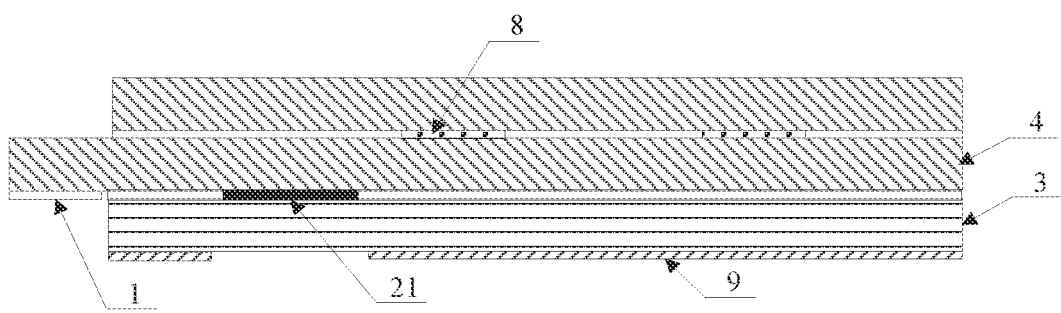
FIG. 18 is a schematic structural diagram of another flexible printed circuit board provided by an embodiment of the present disclosure.

FIG. 18 is a schematic structural diagram of another flexible printed circuit board provided by an embodiment of the present disclosure. When the routing wire 8 is further arranged on the second base material layer 4 where the anti-electromagnetic interference layer 9 is arranged, the anti-electromagnetic interference layer 9 is arranged on the surface of the side, close to the first base material layer 3, of the corresponding second base material layer 4; and the corresponding routing wire 8 is arranged on a different layer from the anti-electromagnetic interference layer 9. In this way, a signal of the routing wire 8 may be shielded by the anti-electromagnetic interference layer 9, electromagnetic interference on the metal connecting wires 21 of the antenna coil 2 may be prevented, and accuracy of a radiation signal when the antenna coil 2 is working is improved.

When no routing wire 8 is arranged on the second base material layer 4 where the anti-electromagnetic interference layer 9 is arranged, the anti-electromagnetic interference layer 9 is arranged on any surface of the corresponding second base material layer 4.

In the embodiments provided by the present disclosure, whether a case that when the routing wire 8 is further arranged on the second base material layer 4 where the anti-electromagnetic interference layer 9 is arranged, the anti-electromagnetic interference layer 9 is arranged on the surface of the side, close to the first base material layer 3, of the corresponding second base material layer 4, and the corresponding routing wire 8 is arranged on a different layer from the anti-electromagnetic interference layer 9, or another case that the anti-electromagnetic interference layer 9 is arranged on any surface of the corresponding second base material layer 4 when no routing wire 8 is arranged on the second base material layer 4 where the anti-electromagnetic interference layer 9 is arranged, the anti-electromagnetic interference layer 9 may be arranged between a layer where the routing wire 8 is located and the layer where the metal connecting wires 21 are located, so as to prevent interference between the routing wire 8 and the metal connecting wires 21.

Figure 19:
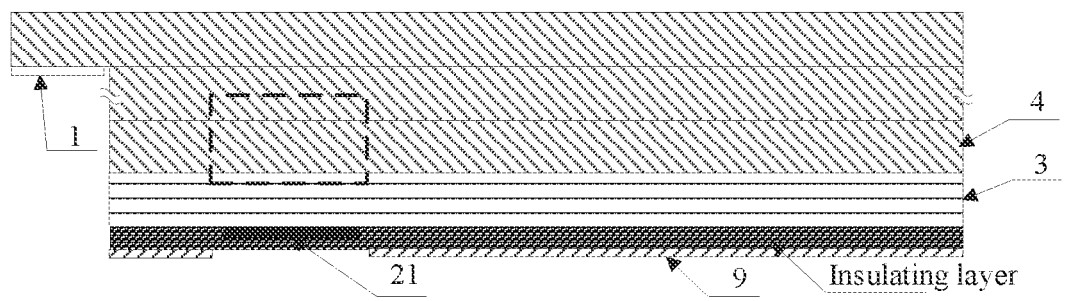
FIG. 19 is a schematic structural diagram of another flexible printed circuit board provided by an embodiment of the present disclosure.

FIG. 19 is a schematic structural diagram of another flexible printed circuit board provided by an embodiment of the present disclosure. In the at least one second base material layer 4 closest to the first base material layer 3, an orthographic projection of the metal connecting wires 21 on the corresponding second base material layer 4 does not overlap with the routing wire 8 and device 7 corresponding to the surface of the second base material layer 4.

As shown in FIG. 19, in the three second base material layers 4 closest to the first base material layer 3, the orthographic projection of the metal connecting wires 21 on the three second base material layers 4 does not overlap with the routing wire 8 on the surface of the corresponding second base material layer 4. If the above three second base material layers 4 include the second base material layer 4 farthest from the first base material layer 3, the orthographic project of the metal connecting wires 21 on the second base material layer 4 farthest from the first base material layer 3 does not overlap with the routing wire 8 and the device 7 on the surface of the corresponding second base material layer 4.

In one possible implementation, the flexible printed circuit board further includes: a test end, arranged on the surface of the side, away from the second base material layer 4, of the first base material layer 3: where the test end is electrically connected to one end, close to the near field communication module, of the metal connecting wires 21; and the test end is configured to connect an impedance test tool.

By arranging the test end specific for the impedance test tool, impedance of the bonding pins 1 may be conveniently measured.

Figure 20:
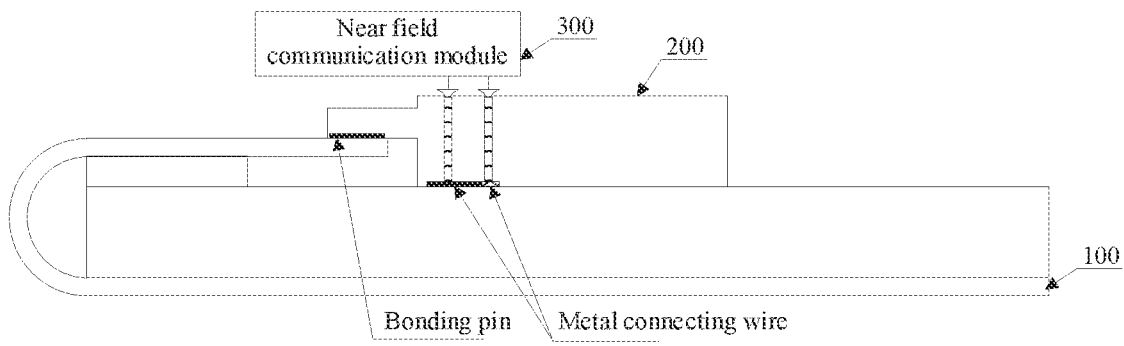
FIG. 20 is a schematic structural diagram of a display apparatus provided by an embodiment of the present disclosure.

Based on the same inventive concept, embodiments of the present disclosure provide a display apparatus. A schematic structural diagram of the display apparatus is as shown in FIG. 20. The display apparatus includes: a display panel 100, the above flexible printed circuit board 200, and a near field communication module 300. The flexible printed circuit board 200 is located on a back side of a display surface of the display panel 100, and a plurality of bonding pins in the flexible printed circuit board are bonded with the display surface of the display panel 100. The near field communication module 300 is electrically connected to an antenna coil in the flexible printed circuit board 200.

In the embodiments provided by the present disclosure, a side of the flexible printed circuit board 200 with the antenna coil is arranged to be close to the display panel 100, a signal transmitted by the antenna coil may be transmitted towards the display panel 100 and does not need to be transmitted from a side facing away from the display panel 100 as other communication modules, so that interference with other communication modules can be reduced. Besides, because a relevant controlling circuit of the display panel 100 is usually arranged on a back side thereof, by arranging the side of the flexible printed circuit board 200 with the antenna coil to be close to the display panel 100, interference on the relevant controlling circuit of the display panel 100 can be reduced.

Figure 21:
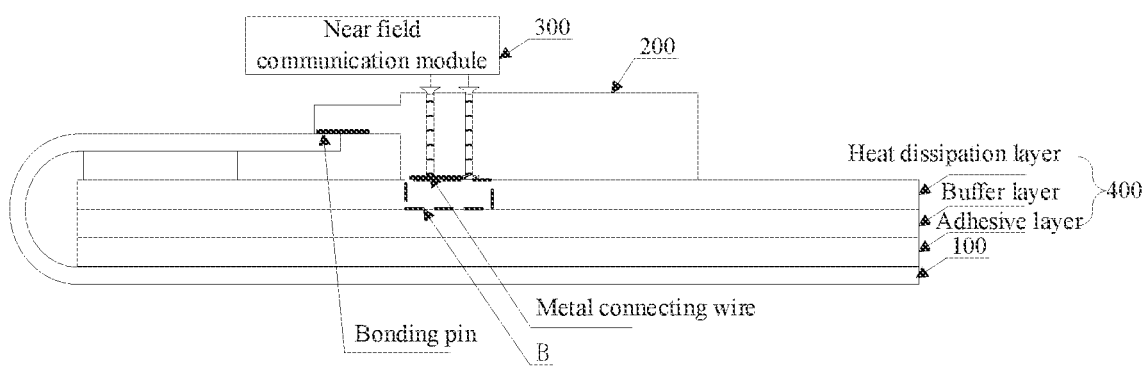
FIG. 21 is a schematic structural diagram of another display apparatus provided by an embodiment of the present disclosure.

FIG. 21 is a schematic structural diagram of another display apparatus provided by an embodiment of the present disclosure.

The apparatus further includes: a super clean foam (SCF) composite film, located between the back side of the display panel 100 and the flexible printed circuit board 200; where the SCF composite film includes a heat dissipation layer, a buffer layer and an adhesive layer which are arranged in a laminated manner: the adhesive layer is fixed to the back side of the display panel 100: the heat dissipation layer has a digging hole region B; and an orthographic projection of the digging hole region B on the flexible printed circuit board 200 covers the metal connecting wires of the antenna coil. A material of the above heat dissipation layer may be copper foil.

By arranging the digging hole region B on the heat dissipation layer of the SCF composite film, the orthographic project of the digging hole region B on the flexible printed circuit board 200 covers the metal connecting wires of the antenna coil, so that the heat dissipation layer of the SCF composite film may be prevented from shielding a signal transmitted by the antenna coil, and the signal of the antenna coil may be transmitted from the side towards the display panel 100 smoothly.

Figure 22:
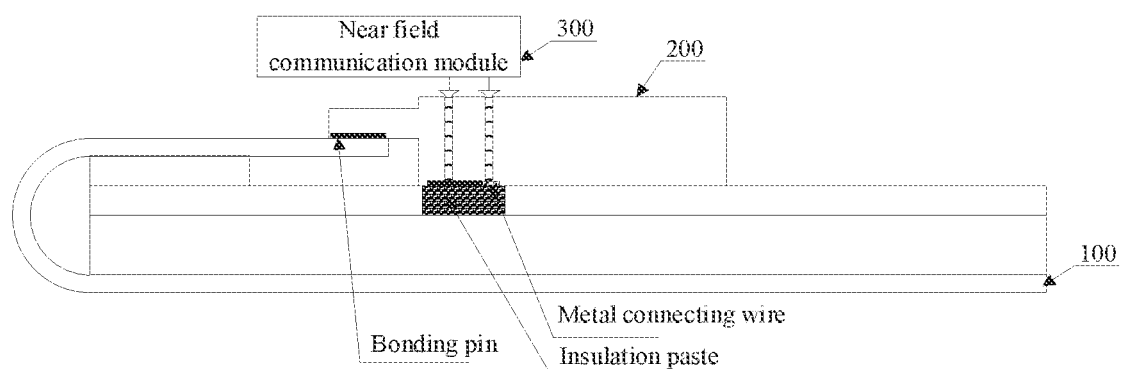
FIG. 22 is a schematic structural diagram of another display apparatus provided by an embodiment of the present disclosure.

FIG. 22 is a schematic structural diagram of another display apparatus provided by an embodiment of the present disclosure. The display apparatus further includes: insulation paste filling the digging hole region B of the heat dissipation layer.

By filling the insulation paste in the digging hole region B of the heat dissipation layer, the signal transmitted by the antenna coil can smoothly pass the digging hole region B of the heat dissipation layer, and a part of the beat dissipation layer with the digging hole region B can be leveled, so that the flexible printed circuit board 200 is bonded to the SCF composite film more firmly.

With further reference to FIGS. 20-22, the antenna coil may be connected to the near field communication module 300 through a clip. In this way, the antenna coil may be better connected to the near field communication module 300. Because the test loop for testing the bonding pins is reused as the antenna coil, cost can be effectively saved.

In the embodiments provided by the present disclosure, the near field communication module 300 may be a near field communication (NFC) module.

It should be understood that, in FIGS. 20-22, for the purpose of better observation, the two metal connecting wires of the antenna coil are illustrated by different filling patterns. In practical application, the two metal connecting wires of the antenna coil are not in contact, and it cannot be speculated from the drawings that they are in contact.

The display apparatus may be a mobile phone, a tablet computer, a smart watch, a smart bracelet or other device that needs to use a near field communication function.

Although the preferred embodiments of the present disclosure are described, those of skill in the art may otherwise make various modifications and variations to these embodiments once they are aware of the basic inventive concept. Therefore, the claims intend to include the preferred embodiments as well as all these modifications and variations falling within the scope of the present disclosure.

Apparently, those skilled in the art may make various modifications and variations to these embodiments without deviating from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A flexible printed circuit board, comprising:
    a plurality of bonding pins, wherein the plurality of bonding pins are configured to be bonded with a display panel, and the plurality of bonding pins comprise impedance test pins; and
    an antenna coil, comprising two metal connecting wires and the two impedance test pins; wherein the metal connecting wires are electrically connected between the impedance test pins and a near field communication module; and when the plurality of bonding pins are bonded with the display panel, the two impedance test pins are electrically connected through a conducting wire in the display panel.

2. The flexible printed circuit board according to claim 1, wherein in the two metal connecting wires, one metal connecting wire is arranged as a helical wire, and other metal connecting wire is arranged on an outer side of the helical wire and partially surrounds the helical wire.

3. The flexible printed circuit board according to claim 2, wherein the helical wire is a quadrate helical wire, and the other metal connecting wire is a broken wire surrounding the quadrate helical wire by half; or
    the helical wire is a circular helical wire, and the other metal connecting wire is an arc surrounding the circular helical wire by half.

4. The flexible printed circuit board according to claim 1, wherein the metal connecting wires comprise:
    a plurality of sub-metal wires; and
    a metal jumper wire; wherein the metal jumper wire is electrically connected to two adjacent sub-metal wires of the plurality of sub-metal wires.

5. The flexible printed circuit board according to claim 1, further comprising:
    a first base material layer arranged close to the display panel; wherein the metal connecting wires are arranged on any surface of the first base material layer; and no entire metal layer is arranged on a surface of a side, facing away from the display panel, of the first base material layer; and
    at least one second base material layer, laminated on a side, away from the display panel, of the first base material layer; wherein the plurality of bonding pins are arranged on a surface of a side of one of the at least one second base material layer; and an orthographic projection of a region, corresponding to the plurality of bonding pins, of the one second base material layer provided with the plurality of bonding pins does not overlap with an orthographic projection of at least one second base material layer close to the plurality of bonding pins.

6. The flexible printed circuit board according to claim 5, further comprising:
    a connecting end, arranged on a surface of a side, away from the first base material layer, of a second base material layer farthest from the first base material layer in the at least one second base material layer; wherein the connecting end is configured to be electrically connected with the near field communication module;
    wherein when the metal connecting wires are arranged on a surface of a side, away from the second base material layer, of the first base material layer, the connecting end is electrically connected to the antenna coil through a connecting hole that penetrates through the at least one second base material layer and the first base material layer; and
    when the metal connecting wires are arranged on a surface of a side, close to the second base material layer, of the first base material layer, the connecting end is electrically connected to the antenna coil through a connecting hole that penetrates through the at least one second base material layer.

7. The flexible printed circuit board according to claim 6, further comprising:
    a device and a routing wire connecting the device and the plurality of bonding pins;
    wherein the device is arranged at a same layer as the connecting end, and the routing wire is arranged on a surface of any of the at least one second base material layer.

8. The flexible printed circuit board according to claim 7, further comprising:
    an anti-electromagnetic interference layer, arranged on a surface of a side, close to the display panel, of the first base material layer;
    wherein an orthographic projection of the anti-electromagnetic interference layer on the first base material layer does not overlap with an orthographic projection of the metal connecting wires on the first base material layer.

9. The flexible printed circuit board according to claim 8, wherein when the metal connecting wires are arranged on the surface of the side, close to the display panel, of the first base material layer, the anti-electromagnetic interference layer covers the metal connecting wires.

10. The flexible printed circuit board according to claim 5, wherein in the at least one second base material layer closest to the first base material layer, an orthographic projection of the metal connecting wires on a corresponding second base material layer does not overlap with a routing wire and device on a surface of the corresponding second base material layer.

11. The flexible printed circuit board according to claim 5, further comprising:
    a test end, arranged on a surface of a side, away from the second base material layer, of the first base material layer;
    wherein the test end is electrically connected to one end, close to the near field communication module, of the metal connecting wires; and the test end is configured to connect an impedance test tool.

12. A display apparatus, comprising: the display panel, the flexible printed circuit board according to claim 1, and the near field communication module;
- wherein the flexible printed circuit board is arranged on a back side of a display surface of the display panel;
- the plurality of bonding pins in the flexible printed circuit board are bonded with the display surface of the display panel; and
- the near field communication module is electrically connected to the antenna coil in the flexible printed circuit board.

13. The display apparatus according to claim 12, further comprising:
- a super clean foam (SCF) composite film, arranged between a back side of the display panel and the flexible printed circuit board;
- wherein the SCF composite film comprises a heat dissipation layer, a buffer layer and an adhesive layer which are arranged in a laminated manner; and
- the adhesive layer is fixed to the back side of the display panel, the heat dissipation layer has a digging hole region, and an orthographic projection of the digging hole region on the flexible printed circuit board covers the metal connecting wires of the antenna coil.

14. The display apparatus according to claim 13, further comprising: insulation paste filling the digging hole region of the heat dissipation layer.

15. The display apparatus according to claim 12, wherein the antenna coil is connected to the near field communication module through a clip.

* * * * *